United States Patent [19]

Bean et al.

[11] Patent Number: 5,250,445
[45] Date of Patent: Oct. 5, 1993

[54] DISCRETIONARY GETTERING OF SEMICONDUCTOR CIRCUITS

[75] Inventors: Kenneth E. Bean, Richardson; Satwinder S. Malhi, Garland; Walter R. Runyan, Dallas, all of Tex.

[73] Assignee: Texas Instruments Incorporated, Dallas, Tex.

[21] Appl. No.: 824,770

[22] Filed: Jan. 17, 1992

Related U.S. Application Data

[63] Continuation of Ser. No. 560,473, Jul. 27, 1990, abandoned, which is a continuation of Ser. No. 287,743, Dec. 20, 1988, abandoned.

[51] Int. Cl.$^5$ .......................................... H01L 21/205
[52] U.S. Cl. ............................................. 437/11; 437/12; 437/24; 437/160; 156/612; 156/613
[58] Field of Search ................. 148/DIG. 3, DIG. 4, 148/DIG. 7, 15, 24, 37, 40, 41, 59, 58, 60, 76, 83, 90, 97, 127, 160, 33-33.2; 156/610-615; 437/20, 24, 25, 81, 89, 90, 95, 97, 110, 126, 131, 10-12, 247, 939, 949, 959, 976

[56] References Cited

U.S. PATENT DOCUMENTS

| | | | |
|---|---|---|---|
| 3,515,956 | 6/1970 | Martin et al. | 437/11 |
| 3,874,936 | 4/1975 | d'Hervilly et al. | 437/12 |
| 3,895,965 | 7/1975 | MacRae et al. | 437/11 |
| 3,969,744 | 7/1976 | Nicholas et al. | 357/22 |
| 3,976,512 | 8/1976 | DeNora et al. | 437/11 |
| 4,082,571 | 4/1978 | Graul et al. | 437/11 |
| 4,114,256 | 9/1978 | Thibault et al. | 437/12 |
| 4,567,645 | 2/1986 | Cavanagh et al. | 437/12 |
| 4,668,304 | 5/1987 | Shachameyer et al. | 437/11 |
| 4,885,257 | 12/1989 | Matsushita | 437/11 |
| 5,094,963 | 3/1992 | Hiraguchi et al. | 437/11 |

FOREIGN PATENT DOCUMENTS

| | | | |
|---|---|---|---|
| 0133954 | 3/1985 | European Pat. Off. | 437/11 |
| 0248224 | 7/1987 | German Democratic Rep. | 437/11 |
| 58-154284 | 9/1983 | Japan | 437/129 |
| 59-119761 | 7/1984 | Japan | 437/12 |
| 0166032 | 7/1986 | Japan | 437/11 |

OTHER PUBLICATIONS

Poponiak et al. "Gettering technique resulting in defect free devices", IBM Tech. Disc. Bull. vol. 16 No. 4, Sep. 1973, p. 1063.
Wolf, "Silicon Processing for the VLSI Era", vol. 1, pp. 141-142, Lattice Press, 1986.
Poponiak et al., "Gettering Utilizing Implant Damage and Highly Disordered Epitaxial Layer", IBM Tech. Disc. Bull., vol. 19, No. 6, Nov. 1976, pp. 2052-2053.
Herzog et al., "X-Ray Investigation of Boron- and Germanium Doped Silicon Epitaxial Layers," J. Electrochem. Soc., vol. 131, No. 12, 1984, pp. 2969-2974.
Wolf et al. *Silicon Processing for the VLSI Era*, Lattice Press, Sunset Beach, Calif., 1986, pp. 516-518.
*Germanium Doped Silicon Misfit Dislocation Gettering and Strain Layer Superlattice Structures via Conventional CVD Epitaxy*, Electrochemical Society, vol. 88-1 (May 15-20, 1988), Kenneth E. Bean et al., pp. 1-22.

Primary Examiner—Olik Chaudhuri
Assistant Examiner—Ourmazd S. Ojan
Attorney, Agent, or Firm—Brian C. McCormack; Ira S. Matsil; Richard L. Donaldson

[57] ABSTRACT

A semiconductor wafer (32) is patterned to have gettering areas (36-38) selectively positioned proximate devices (44-46) which require gettering. The areas (36-38) comprise germanium-doped silicon having a germanium concentration of approximately 1.5%-2.0%. The germanium creates a lattice mismatch between the substrate (32) and an epitaxial layer (34) which is sufficient to produce defects capable of gettering contaminants. The gettering areas (36-38) may be formed by selective deposition, selective etching, ion-implantation or selective diffusion techniques.

18 Claims, 1 Drawing Sheet

DISCRETIONARY GETTERING OF SEMICONDUCTOR CIRCUITS

This application is a continuation of U.S. patent application Ser. No. 07/560,473, filed Jul. 27, 1990, now abandoned, which is a continuation of U.S. Pat. Ser. No. 287,743, filed Dec. 20, 1988, now abandoned.

TECHNICAL FIELD OF THE INVENTION

This invention relates in general to semiconductor devices and processing, and in particular to a method for the discretionary gettering of semiconductor devices and devices formed thereby.

BACKGROUND OF THE INVENTION

Silicon semiconductor substrates, which are used to manufacture integrated circuits, are susceptible to contamination from the diffusion of impurities. The contaminants may come from a surface material upon which the wafer is placed for processing or from any of the many processes to which the wafer is subjected. The contaminants may be picked up from the backside or the frontside of the wafer and may diffuse therethrough in either direction. The contaminants, which typically are heavy metals such as gold, copper, iron, nickel, etc., may show up on a surface of the wafer as a haze which is visible to the human eye.

Contaminants may, however, be both beneficial and detrimental to the integrated circuits being formed on the semiconductor wafer. Contaminants may cause low lifetime or high leakage current. Thus contaminants are not desirable wherever high lifetime is sought, such as in memory-type semiconductor devices. Whenever high lifetime is desired, contaminants must be gettered away from the device by some type of gettering method. Conversely, for example, in high speed switching devices, low lifetime is desired and therefore, contaminants do not need to be gettered.

Typical gettering methods currently in use include backside gettering, intrinsic oxygen precipitation gettering or a combination of backside and intrinsic oxygen precipitation gettering. In backside gettering, mechanical abrasions, silicon nitride, high phosphorus concentration, or a polysilicon layer is applied to the backside of the semiconductor wafer. These materials serve as an effective sink for contaminants in the wafer which are diffused through the thickness thereof. In oxygen precipitation gettering, the wafer is processed through a high temperature-low temperature-high temperature cycle to produce denuded zones near the top and bottom surfaces of the wafer which are relatively clear of contaminants, oxygen precipitates and other defects congregate in the center portion of the wafer and act as gettering sites.

The trend in semiconductor processing is toward lower processing temperatures and layer diameter, thus thicker wafers. Unfortunately, the thicker a substrate becomes, the less effective backside gettering becomes. Likewise, intrinsic oxygen precipitation gettering becomes less effective with lower processing temperatures. Thus, there is a need for a method to effectively getter a relatively thick substrate at relatively lower processing temperatures, as well as to discretionarily getter devices formed thereon.

SUMMARY OF THE INVENTION

The present invention disclosed herein comprises a method for discretionarily (or localized) gettering semiconductor circuits which substantially reduces or eliminates problems with prior gettering methods. The present invention allows the formation of improved semiconductor circuits by selectively gettering contaminants from a semiconductor substrate.

In accordance with one aspect of the invention, a semiconductor wafer is gettered. A mismatch dislocation strain field is formed over the semiconductor wafer by depositing a germanium-doped silicon film thereon. A subsequent epitaxial film in which integrated circuits are to be formed is deposited over the strain field. The strain field acts as a getterer for contaminants and is in near proximity to the active devices.

In a further aspect of the present invention, the germanium-doped silicon film comprises a molar concentration of 1.5%–2.0% germanium. The film may be deposited by selective deposition, uniform deposition followed by etching, ion-implantation or diffusion techniques.

In a still further aspect of the present invention, semiconductor devices may be selectively gettered or ungettered. A long lifetime device such as a memory circuit may be gettered to remove lifetime killing contaminants. A short lifetime device such as a high-speed switching device may be placed adjacent the long lifetime device without gettering contaminants therefrom. The method in accordance with the present invention allows the selective positioning of gettering areas not possible in the prior art.

It is a technical advantage of the present invention that a semiconductor substrate may be effectively gettered on a selective basis. It is possible to position a gettered area proximate a specific integrated circuit device to prevent latch-up or to provide enhanced device lifetime.

BRIEF DESCRIPTION OF THE DRAWINGS

For a more complete understanding of the present invention and for further advantages thereof, reference is now made to the following Detailed Description taken in conjunction with the accompanying Drawings, in which.

DETAILED DESCRIPTION OF THE INVENTION

Figure 1:
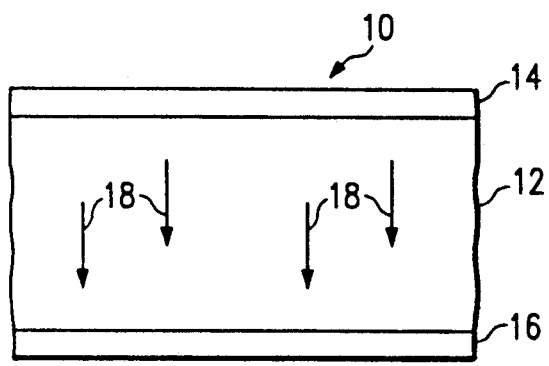
FIG. 1 is a cross-sectional view of a wafer gettered using polysilicon backside gettering in accordance with the prior art.

Referring to FIG. 1, a cross-sectional view of a semiconductor wafer gettered in accordance with the prior art is generally identified by the reference numeral 10. The wafer 10 comprises a silicon substrate 12 with an epitaxial film 14 formed on one surface thereof. On the opposite surface of the substrate 12, fox example, a polysilicon backside gettering layer 16 is formed. The devices that will make up integrated circuits on the wafer 10 will be formed in the epitaxial film layer 14.

Epitaxial film layers comprise a very thin layer of silicon that is deposited on a silicon substrate, usually by chemical vapor deposition. The lattice structure of the epitaxial layer is identical to that of the silicon substrate and is formed to provide a layer with a different conductivity due to its relative purity compared to the substrate. Typically, the active components of a semiconductor device are totally formed in the epitaxial layer.

The polysilicon layer 16 acts as a getterer to attract impurities within the silicon substrate 12, as well as any impurities that may be picked up during the various processes necessary to form integrated circuits on the wafer 10. The impurities diffuse through the substrate 12 toward the polysilicon layer 16, as indicated by arrows 18. If the substrate 12 is relatively thin, backside gettering may be sufficiently effective. However, if the substrate 12 becomes thicker due to an increased wafer diameter, the effectiveness of backside gettering is reduced and problems may occur with premature latch-up or loss of device lifetime.

Figure 2:
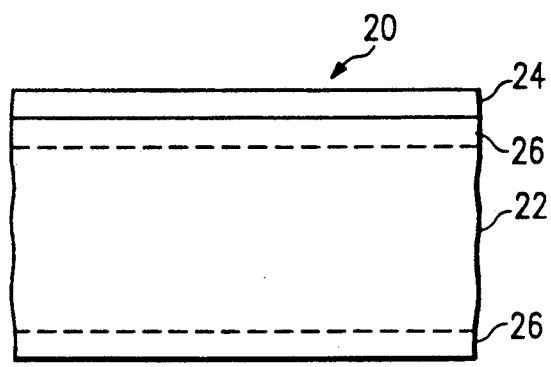
FIG. 2 is cross-sectional view of a semiconductor wafer gettered using intrinsic oxygen precipitation gettering in accordance with the prior art.

Referring to FIG. 2, a semiconductor wafer gettered in accordance with the prior art method of intrinsic oxygen precipitation is generally identified by the reference numeral 20. The wafer 20 comprises a silicon substrate 22 and an epitaxial film layer 24, formed thereon subsequent to the oxygen precipitation gettering cycle.

The wafer 20 is placed in a thermal oven for a standard high-low-high temperature cycle to produce oxygen precipitation denuded areas 26. The denuded areas 26 are relatively cleared of contaminants by the temperature cycling. When the silicon substrate 22 is relatively thick, and processing temperatures are relatively low, intrinsic oxygen precipitation gettering to the center of the wafer thickness, becomes less effective and problems may occur with premature latch-up or loss of device lifetime.

Figure 3:
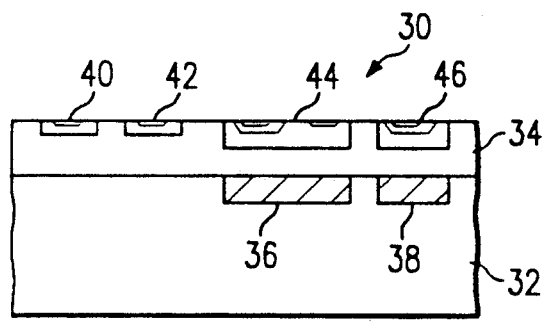
FIG. 3 is a cross-sectional view of a device formed in accordance with the preferred embodiment of the present invention.

Referring to FIG. 3, a semiconductor wafer constructed in accordance with the preferred embodiment of the present invention is generally identified by the reference numeral 30. The wafer 30 comprises a silicon substrate 32 and an epitaxial film layer 34. Within the silicon substrate 32 at the interface between the epitaxial layer 34 and substrate 32 are gettering areas 36 and 38 which are formed in accordance with the present invention, as will be subsequently described in greater detail. Prior to the formation of the layer 34, a hydrochloric acid vapor etch may be conducted in situ to remove surface contaminants.

Formed within the epitaxial layer 34 are integrated circuit devices, such as devices 40, 42, 44 and 46. Devices 44 and 46, which may be, for example, memory devices, require relatively high lifetime and are, therefore, gettered to remove contaminants by the corresponding proximity gettering areas 36 and 38. The devices 40 and 42, which may be high-speed switching devices, require lower lifetime and, therefore, do not need to be gettered but may need deliberate lifetime reduction.

The gettering areas 36 and 38 form a lattice mismatch between the silicon substrate 32 and the epitaxial layer 34 as opposed to the normal matching of lattices. Testing, as disclosed in Bean, et al., *Germanium Doped Silicon Misfit Dislocation Gettering and Strain Layer Superlattice Structures via Conventional CVD Epitaxy*, Electrochemical Society Vol. 88-1 (May 15-20, 1988), which is incorporated herein by reference, has shown that a material such as, for example, germanium, due to differences in the covalent radii of silicon and germanium (1.17 Angstroms vs. 1.22 Angstroms, respectively), will cause sufficient strain to provide lattice mismatch therebetween. The degree of strain is a function of the percentage of germanium to silicon and has been found through testing to be preferable at 1.5%-2.0%. The lattice mismatch thus formed between germanium areas 36 and 38 of the silicon substrate 32 and the silicon epitaxial layer 34 causes a lattice mismatch dislocation strain field. Contaminants are gettered to the lattice mismatch dislocations at gettering areas 36 and 38.

The mismatch dislocation strain field may be created by the addition of atoms which have a substantially different (larger or smaller) ionic radius than that of silicon. Thus, the following elements are other examples of possible sources: boron, aluminium, gallium, tin, phosphorus, arsenic and antimony.

Figure 4:
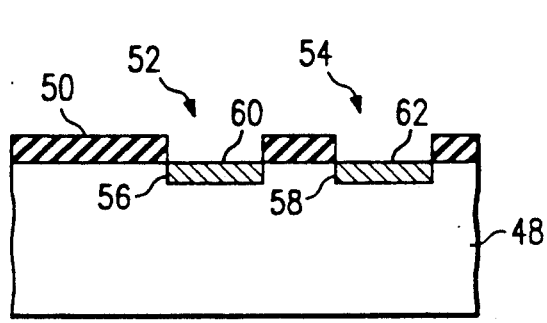
FIG. 4 is a cross-sectional view illustrating the preferred method of the present invention.

Referring to FIG. 4, a silicon semiconductor substrate 48 is processed in accordance with the preferred method of the present invention. A photoresist layer 50 is applied over a surface of the silicon substrate 48 and is masked and patterned using standard photolithographic processes, as are well known in the art, to form recesses 52 and 54 therein. The exposed silicon substrate 48 is then etched to form recesses 56 and 58 therein.

Layers 60 and 62 of germanium-doped silicon are selectively deposited to fill the recesses 56 and 58. The photoresist 50 may then be stripped using a solvent based stripper. An epitaxial film layer (not shown) may be formed over the silicon substrate 48 and the germanium-doped silicon layers 60 and 62. Integrated circuit devices are then processed in the expitaxial film.

The germanium-doped silicon preferably comprises 1.5%-2.0% germanium which is sufficient to cause a slight lattice mismatch between the substrate 48 and the subsequently applied epitaxial layer. The lattice mismatch produces dislocations which serve to getter impurities in the substrate 48 and process induced impurities away from the circuit devices formed proximate the layers 60-62.

Figure 5:
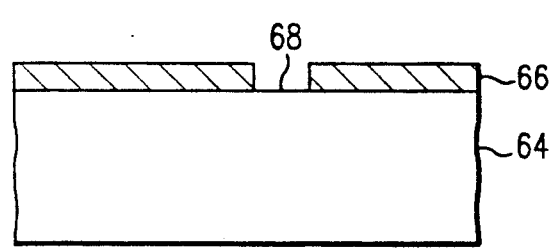
FIG. 5 is a cross-sectional view of an alternative embodiment of the method of the present invention.

Referring to FIG. 5, an alternative method in accordance with the present invention of forming gettering areas is illustrated. A silicon substrate 64 is completely covered with a germanium-doped silicon layer 66 which preferably comprises 1.5%-2.0% germanium. The layer 66 may then be patterned using standard photolithographic techniques and unwanted portions thereof etched to form ungettered areas such as area 68.

If planarization is a concern, the planarization of the surface may be re-established by a standard boron/phosphorus/glass (BPSG) application, as is well known in the art. The layer 66 provides a slight lattice mismatch dislocation strain field between a subsequently applied epitaxial layer (not shown) and the silicon substrate 64 to getter impurities from selected area devices formed in the epitaxial layer.

Figure 6:
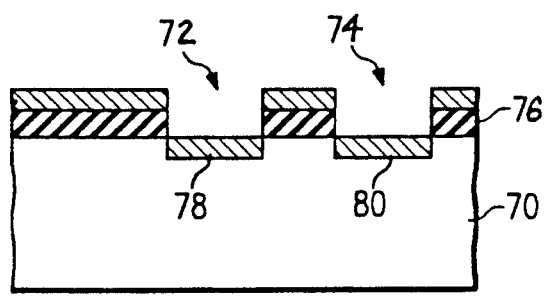
FIG. 6 is a cross-sectional view of a further alternative embodiment of the method in accordance with the present invention.

Referring to FIG. 6, a further alternative embodiment of the present invention is illustrated. A silicon semiconductor substrate 70 is patterned using standard photolighographic processes to form recesses 72 and 74 in a photoresist layer 76. A standard ion-implantation, as is well known in the art, is then used to implant germanium into the photoresist 76 and the exposed silicon semiconductor substrate 70 within the recesses 72 and .4, as illustrated by areas 78 and 80.

A standard photoresist strip is then performed to remove the photoresist 76 and the ion-implantation thereon. The germanium implanted into the areas 78 and 80 is preferably at a concentration of 1.5%-2.0% germanium to silicon to form sufficient lattice mismatch between the substrate 70 and a subsequently applied epitaxial layer (not shown) to getter contaminants.

Figure 7:
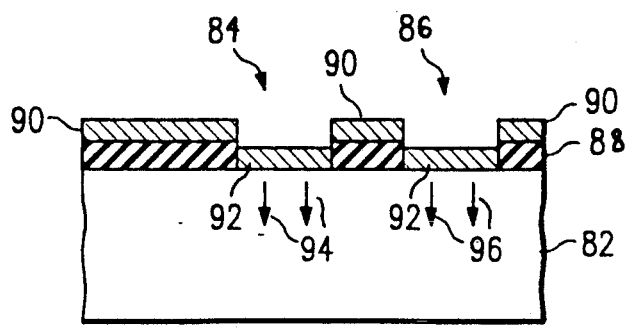
FIG. 7 is a cross-sectional view of a still further alternative embodiment of the present invention.

Referring to FIG. 7, a still further alternative embodiment of the present invention is illustrated. A silicon semiconductor substrate 82 is masked, using standard photolithographic processes to form recesses 84 and 86 within a photoresist layer 88. Germanium as indicated at 90-92 is then deposited over the entire surface to cover the photoresist 88, as well as the exposed silicon substrate 82 within recesses 84 and 86.

A standard thermal processing in a diffusion oven is conducted to diffuse the germanium 92 in the recesses 84 and 86 into the silicon substrate 82, as illustrated by arrows 94 and 96. The germanium 90-92 is preferably deposited to form a 1.5%-2.0% concentration with the silicon substrate 82 to form a slight lattice mismatch between the substrate 82 and a subsequently applied epitaxial layer (not shown). Contaminants will be selectively gettered from the substrate 82 to the germanium-doped silicon and away from any devices formed in the epitaxial layer.

Integrated circuit devices which are formed in the subsequently applied epitaxial layer may thus be selectively gettered or ungettered. If long lifetime is desired for a circuit device such as a memory device, a mismatch strain field in accordance with the present invention may be formed proximate the device to getter any contaminants.

If short lifetime devices such as high-speed switches are positioned proximate the long lifetime devices, the short lifetime devices will be unaffected by the lattice mismatch strain fields. Thus, short and long lifetime devices may be effectively positioned proximate each other in the same layer of construction without interference from divergent gettering requirements.

Although the present invention as been described with respect to specific preferred embodiments thereof, various changes and modifications may be suggested to one skilled in the art (for example, tin (Sn) is another Group IV element that may be used to produce the desired strain fields and not effect the conductivity or type of the silicon semiconductor). It is intended that the present invention encompass such changes and modifications as fall within the scope of the appended claims.

What is claimed is:

1. A method for forming an integrated circuit having a multiplicity of devices, comprising the steps of:
   providing a silicon substrate;
   introducing germanium atoms into selected areas of a surface of said substrate to form gettering areas, wherein said gettering areas have a molar concentration of between about 1.5% and 2.0% of germanium to germanium-doped silicon;
   forming a crystalline semiconductor layer on said surface of said silicon substrate such that a lattice mismatch strain field exists between said gettering areas of said substrate and said crystalline layer; and
   forming at least some of said multiplicity of devices in said crystalline layer, selected ones of said at least some devices disposed proximate said gettering areas having a lattice mismatch and at a surface of said crystalline layer spaced from said gettering areas such that contaminants migrate to said gettering areas and forming at least some others of said multiplicity of devices in said crystalline layer, said some others of said multiplicity of devices disposed such that contaminants are not substantially gettered from said some others of said multiplicity of devices.

2. A method as in claim 11 wherein said introducing of germanium atoms is performed by ion implantation.

3. A method as in claim 2 wherein said ion implantation is performed through a mask to provide selected areas where said germanium is introduced into said substrate.

4. The method of claim 1, wherein the step of forming said gettering areas comprises:
   depositing a germanium-doped silicon film over the wafer; and
   selectively etching said film to form gettered areas with said film and ungettered areas without said film.

5. The method of claim 1, wherein the step of forming said gettering areas comprises selectively diffusing germanium into the wafer.

6. A method for forming an integrated circuit in a silicon layer formed on a silicon substrate, said integrated circuit having at least one device of a multiplicity of devices formed proximate a gettering area formed in said substrate, said method comprising the steps of:
   providing a silicon substrate;
   introducing germanium atoms to form at least one gettering area within said substrate at a selected location, wherein said gettering area has a molar concentration of between about 1.5% and 2.0% of germanium to germanium-doped silicon; and
   forming said at least one device in said silicon layer and selectively spaced from said selected location such that said gettering area attracts contaminants away from said at least one device and forming at least one other device in said silicon layer and selectively spaced form said selected location such that said gettering area does not substantially attract contaminants away from said at least one other device.

7. A method as in claim 6 wherein said introducing of germanium atoms is performed by ion implantation.

8. A method as in claim 7 wherein said ion implantation is performed through a mask to provide selected areas where said germanium is introduced into said substrate.

9. The method of claim 6, wherein said gettering area is formed by depositing a germanium-doped silicon film over the wafer.

10. The method of claim 9, wherein the step of depositing further comprises selectively depositing said film.

11. The method of claim 10, wherein the step of selectively depositing comprises;

patterning photoresist on the wafer;

forming recesses within the wafer corresponding to said pattern;

depositing said filming said recesses; and stripping said photoresist.

12. The method of claim 9, further comprising the step of selectively etching said film.

13. The method of claim 12, wherein the step of selectively etching comprises:

masking said film with a photoresist pattern; and etching said film to form gettered and ungettered areas.

14. The method of claim 13, further comprising the step of replanarizing the wafer with a boron/phosphorus/glass application.

15. The method of claim 6, wherein the step of forming said at least one gettering area comprises selectively diffusing germanium into the wafer.

16. The method of claim 6, wherein the step of forming gettering areas comprises:

masking the substrate to form gettered areas and ungettered areas;

etching the substrate to form recesses therein in said gettered areas;

depositing a germanium-doped silicon film in said recesses in said gettered areas; and stripping said mask from said ungettered areas.

17. The method of claim 16, wherein the step of masking comprises forming an oxide over said ungettered areas.

18. The method of claim 16, wherein the step of depositing comprises depositing a 1.5%–2.0% germanium-doped silicon film.

* * * * *